United States Patent [19]
Nakajima et al.

[11] Patent Number: 5,753,907
[45] Date of Patent: May 19, 1998

[54] MULTIPLE BEAM SCANNING APPARATUS

[75] Inventors: Tomohiro Nakajima; Masaki Narita, both of Tokyo; Akira Shimura, Kawasaki; Shuichi Yamazaki, Fujimi, all of Japan

[73] Assignee: Ricoh Company, Ltd., Tokyo, Japan

[21] Appl. No.: 653,694

[22] Filed: May 23, 1996

[30] Foreign Application Priority Data

May 24, 1995 [JP] Japan ................... 7-124782

[51] Int. Cl.$^6$ .................. G01P 9/42; H01J 3/14
[52] U.S. Cl. .................. 250/234; 250/236; 250/225; 359/204
[58] Field of Search .................. 250/234–236, 250/225, 205; 359/204, 205, 217, 618, 495–497

[56] References Cited

U.S. PATENT DOCUMENTS

| | | |
|---|---|---|
| 5,007,692 | 4/1991 | Matsura .................. 250/236 |
| 5,018,806 | 5/1991 | Nakajima . |
| 5,113,279 | 5/1992 | Hanamoto et al. .......... 359/204 |
| 5,153,768 | 10/1992 | Appel .................. 250/236 |
| 5,210,635 | 5/1993 | Nagata et al. ........... 359/204 |
| 5,233,188 | 8/1993 | Arimoto et al. ........... 250/225 |
| 5,347,124 | 9/1994 | Narukawa et al. .......... 250/235 |
| 5,371,608 | 12/1994 | Muto et al. .............. 250/236 |

*Primary Examiner*—Stephone Allen
*Attorney, Agent, or Firm*—Oblon, Spivak, McClelland, Maier & Neustadt, P.C.

[57] ABSTRACT

A multiple beam scanning apparatus in which a plurality of light beams are repeatedly scanned at the same time, including a light source unit defining an optical axis and including plural laser diodes, collimator lenses for respectively converting light beams emitted by the laser diodes to respective parallel light fluxes, and a beam composing unit for superposing the light beams and emitting the superposed light beams therefrom. The light source unit is rotatively adjustable around the optical axis and is constructed such that respective light fluxes emitted from the beam composing unit are emitted with predetermined respective different angles at least in a main scanning direction.

17 Claims, 5 Drawing Sheets

MULTIPLE BEAM SCANNING APPARATUS

BACKGROUND OF THE INVENTION

1. Field of the Invention

The present invention relates to an optical scanning apparatus employed in the writing-in system of a digital copying machine, a laser printer, etc., and in particular, a scanning apparatus having improved recording speed achieved by multiple beam scanning.

2. Description of the Related Arts

In one method of raising recording speed in optical scanning employed in the writing-in system, the rotation speed of the rotational multiple-surfaces mirror employed as the deflection medium is raised. However, in this method, several problems need to be solved; namely, the durability of the motor, the material property of the multiple-surfaces mirror, etc., and there is a limit on the recording speed which can be achieved. In order to lower the rotation speed of the multiple-surfaces mirror without decreasing the recording speed, the scanning operation is performed at one time by use of a plurality of laser light rays.

As a multiple beam scanning apparatus for performing the scanning operation in such a manner, Japanese Laid-open Patent Publication No. 60-32019/1985 discloses a light source system including plural laser diodes which emit light rays fluxes therefrom. On the other hand, Japanese Laid-open Patent Publication No. 2-54211/1990 proposes another light source system employing a laser diode array including a plurality of light emitting sources.

The adjustment of scanning line pitch is performed, by changing the inclination of the optical axis in the sub-scanning direction in the former method, and by changing the inclination of the light source around the optical axis in the latter method. Furthermore, since the laser diode is employed in the former case, there exists a merit that the wavelength and the output can be freely selected, and thereby the utilization area can be widened.

Further, Japanese Patent Application No. 5-216800/1993 proposes another method of solving the problem of beam pitch variation due to environmental variation.

Generally, in the conventional multiple beam scanning apparatus, a predetermined scanning line pitch cannot be obtained due to tolerances in the assembly and mechanical processing of the optical element when the light source portion is mounted on the apparatus frame, and therefore it is absolutely necessary to perform an adjustment to achieve the desired scanning line pitch. The present invention was made in consideration of the shortcomings of the prior art.

SUMMARY OF THE INVENTION

Accordingly, it is an object of the present invention to solve the shortcomings above-noted in the prior art.

It is another object of the present invention to facilitate the adjustment of the scanning line's pitch by rotatively adjusting the composed light beam around the optical axis, without requiring any complicated adjustment mechanism.

It is still another object of the present invention to enable to obtain a predetermined beam spot diameter on the surface to be scanned when the light beam is rotatively adjusted.

It is still another object of the present invention to enable to perform such adjustment only by replacing the light source unit by another one at the time of changing the beam spot diameter, without doing any troublesome tasks such as changing of the optical parts.

It is still another object of the present invention to facilitate easy changing of the beam spot diameter, such as simply by changing of the light source unit.

It is still another object of the present invention to maintain constant exposure intensity when the light beam is rotatively adjusted.

It is still another object of the present invention to prevent the occurrence of the exposure intensity variation even when the light beam is rotatively adjusted and the scanning line pitch, etc. is compensated automatically.

These and other objects of the present invention are achieved by providing a new and improved multiple beam scanning apparatus including a light source unit substantially unitarily constructed with plural laser diodes, a collimator lens for respectively converting the light beams emitted by the laser diodes to respective parallel light beam fluxes, and a beam composing medium for superposing the light beam fluxes and emitting the superimposed light beam fluxes therefrom. The light source unit is constructed such that the respective light fluxes emitted from the beam composing medium are emitted with predetermined respective different angles at least in the main scanning direction. In addition, the aforementioned composed light beams can be rotatively adjusted around the optical axis of the light source unit. In this way, the pitch in the sub-scanning direction of the respective optical axis is adjusted by rotative adjusting around the optical axis the light source portion which is constructed so as to emit the respective light fluxes from the beam composing medium at a distance of predetermined angle in the main scanning direction.

In one embodiment, the apparatus of the present invention further includes a circular iris plate having a circular slit on the optical path from each laser diode to the beam composing medium, and a beam shaping medium provided at a downstream side of the beam composing medium, to shape the emitted light fluxes to form a predetermined light rays flux diameter at least in the sub-scanning direction. In this embodiment, the respective light beams are shaped by the circular iris plate, and a predetermined light flux diameter is maintained when the light beam passes through the beam shaping medium when the light beam is rotatively adjusted by rotating the light source unit. Consequently, a predetermined beam spot diameter can be obtained on the surface to be scanned.

Preferably, the beam shaping medium is supported unitarily together with the light source unit, and the beam shaping medium is rotatively moved around the optical axis thereof relative to the light source unit. Since the beam shaping medium is unitarily supported together with the light source portion and the beam shaping medium is rotatively moved around the optical axis thereof relatively to the light source unit, it is sufficient only to change the light source unit by rotative adjustment of the light beam at the time of changing the beam spot diameter.

In one embodiment of the present invention, the light source unit includes a laser diode array having plural light emitting sources arranged in an array, and the collimator lens converts light beams emitted from the laser diode array to respective parallel light beam fluxes.

In this embodiment, the light source unit is rotatable around an optical axis of the light beam fluxes from the laser diode array, and the plurality of light beam fluxes are simultaneously and repeatedly scanned, and the beam shaping medium is unitarily supported together with the light source unit and is rotatively moved around the optical axis thereof relative to the light source unit. In this embodiment, since the beam shaping medium is unitarily supported together with the light source portion, and the beam shaping medium can be rotatively moved around the optical axis thereof relatively to the light source portion, it is sufficient only to change the light source portion by the rotative adjustment of the light beam at the time of changing the beam spot diameter. Further, since the beam shaping medium can be rotatively moved around the optical axis thereof relatively to the light source portion, when the above-mentioned rotation adjustment is done, the beam shaping medium is not rotatively moved following the above adjustment, and therefore, the position of the light flux is always kept constant after passing through the beam shaping medium, so that a predetermined shape of the beam spot can be obtained on the recording surface to be scanned.

Preferably, the beam shaping medium includes a rectangular aperture unitarily formed with an apparatus frame, so that it is sufficient only to exchange the light source portion when the beam spot diameter is changed, and there is further provided a light intensity change controlling medium for variably controlling the light intensity emitted from the laser diode array in accordance with an installment angle at the time of rotatively adjusting the light source unit, so that the intensity of exposing does not change. The light intensity change controlling medium includes a light intensity detecting medium for detecting the light intensity change of the respective light beam fluxes from the aperture to the surface to be scanned for controlling the detected light intensity change, and thereby for relating the light intensity change thus controlled to the intensity of the light rays to be emitted, so that the intensity of exposing does not change even in the case of rotatively adjust the light beam and automatically compensating the scanning line pitch, etc.

Further, according to the present invention, the light intensity change controlling medium includes a light intensity change calculating medium for calculating the changing value of the emitted light intensity in correspondence with the installment angle of the light source, so that the intensity of exposing does not change even in the case of automatically compensating the scanning line pitch, etc.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 1b is an explanatory diagram showing an enlarged cross-section of the beam composing medium shown in FIG. 1a, including light paths of the light beams respectively emitted from the laser diodes also shone in FIG. 1a;

FIG. 1c is a diagram showing the waveforms of the light rays before and after passing through the half wavelength plate shown in FIG. 1a;

DETAILED DESCRIPTION OF THE PREFERRED EMBODIMENT

Figure 1A:
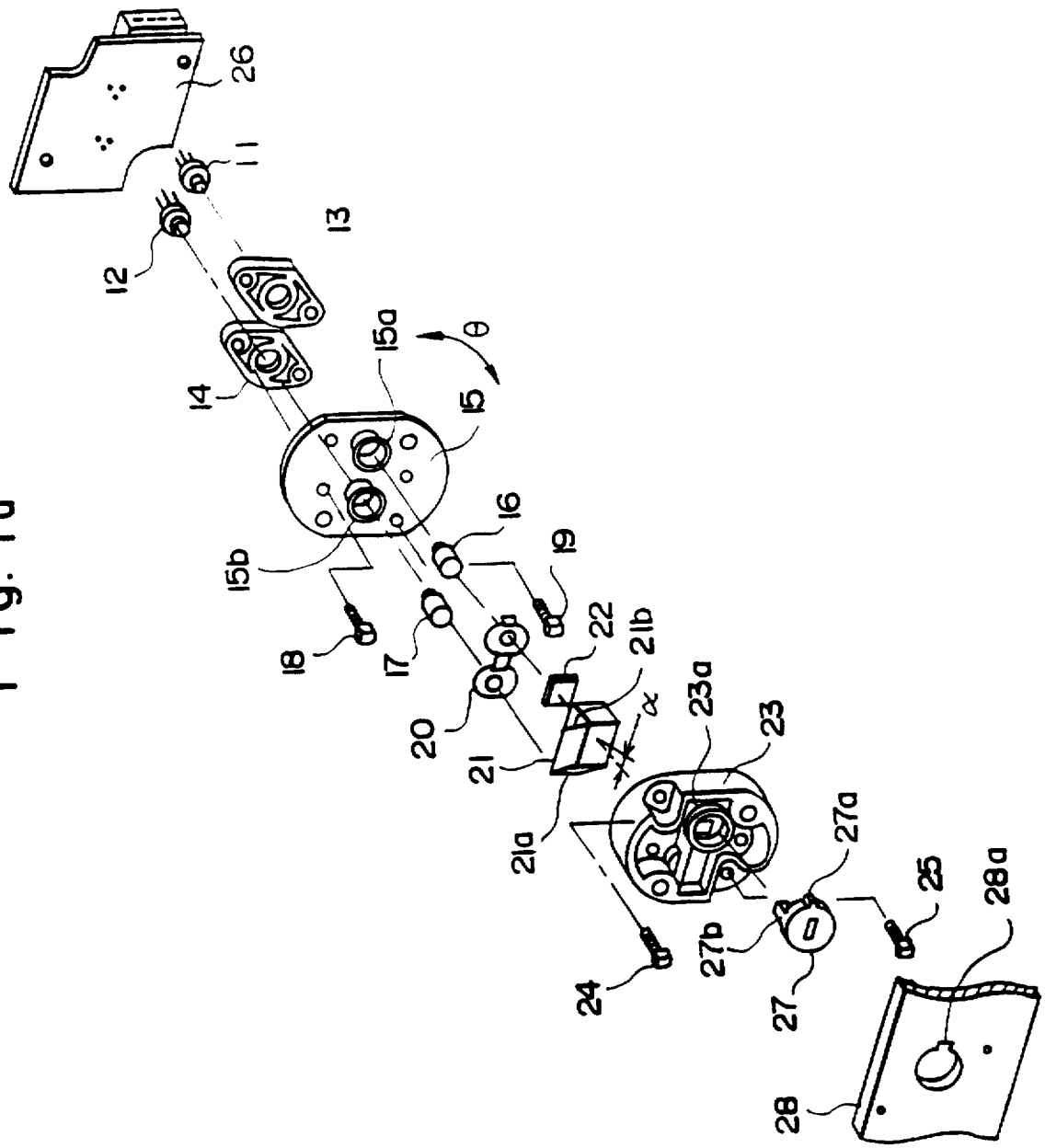
FIG. 1a is an exploded perspective view showing an embodiment of a multiple beam scanning apparatus structure according to the present invention.

Referring now to the drawings, wherein like reference numerals refer to the same or corresponding parts throughout the several views, an example of multiple beam scanning apparatus construction employing two laser diodes is described in reference to FIG. 1a, which is an exploded perspective view showing the construction of optical elements of the multiple beam scanning apparatus of the present invention. As shown in FIG. 1a, the laser diodes 11 and 12 are respectively fixed on the supporters 13 and 14, and assembled with the rear surface of the base body 15 with the screws 18 and 19 so as to coincide with the optical axis of collimator lenses 16 and 17. The collimator lenses 16 and 17 are accommodated in and engaged with tightly engaging holes 15a and 15b of the base body 15 performing the positional adjustment respectively with the laser diodes 11 and 12, and bonded to the holes 15a, 15b by binding agent, etc. The collimator lenses 16 and 17 convert the respective light fluxes from the laser diodes 11,12 to parallel light fluxes. The light rays emitted from the collimator lenses 16 and 17 are form-shaped by respective circular slits of the iris plate 20 for the respective light rays and composed by a beam composing medium 21. Moreover, although the iris plate 20 is provided separately in the present embodiment, the engaging holes 15a and 15b engaging the collimator lenses 16 and 17 can be commonly used as the iris plate.

Figure 1B:
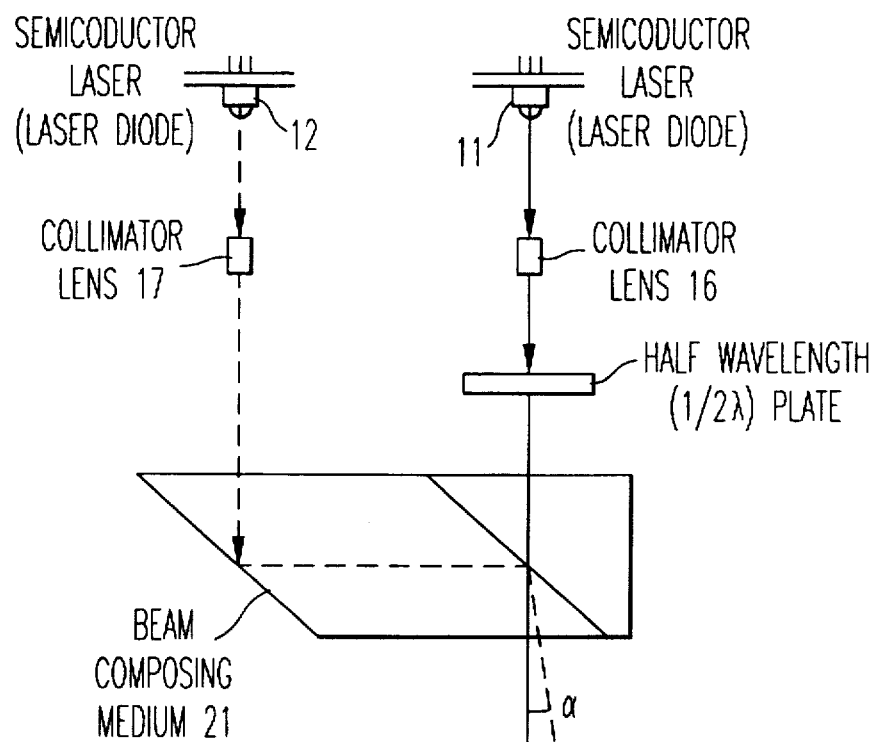
Figure 1C:
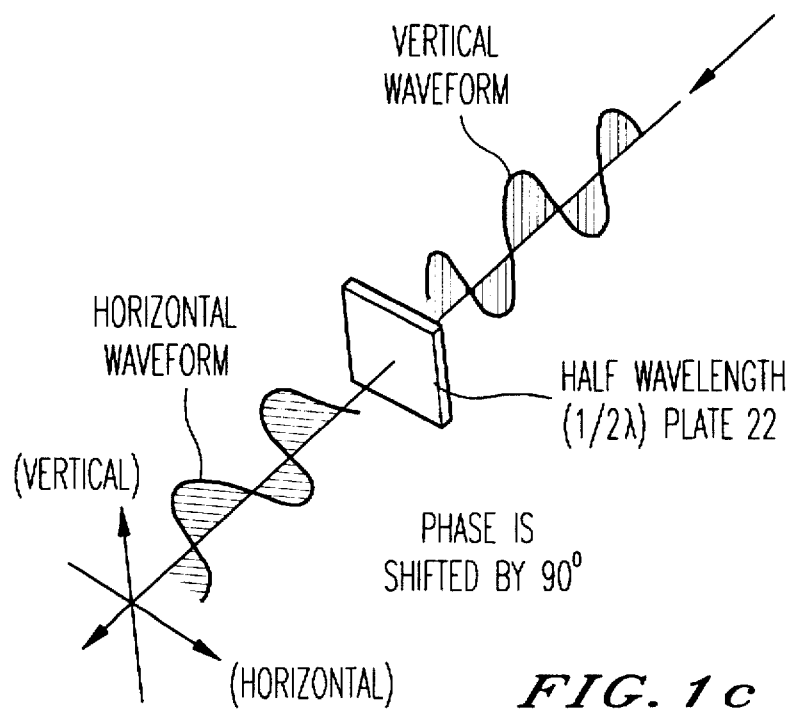

Next, the beam composing medium 21 is described referring to FIGS. 1a and 1b. The laser diodes 11 and 12 are arranged on a common plane with the p-n junction surfaces thereof abutting each other. The polarization of either one of the beams (beam of the laser diode 11) is rotated by 90° by half wavelength plate 22 mounted on the incident surface of the beam composing medium 21, and the beam passes through on the polarized beam splitter surface 21b of the beam composing medium 21. FIG. 1c shows the respective waveforms of the light beams before and after passing through the half wavelength plate 22. Furthermore, the beam of the laser diode 12 is internally reflected on the slanted surface 21a of the beam composing medium 21 and further reflected on the polarized beam splitter surface 21b of the beam composing medium 21. The reflected beam is composed with the beam of the laser diode 11 near the optical axis of the laser diode 11 serving as the standard. Optical axes relating to the respective laser diodes 11 and 12 are set so as to be inclined with respect to each other by the angle α, as shown at the output side of the beam composing medium 21, i.e., slightly deviated from each other by the small angle a in the main scanning direction. The angle α is obtained, for example, by displacing the laser diode 12 in relation to the collimator lens 17 to produce an eccentricity in the emitted beam from the collimator 17. The beams emerging from the beam composing medium 21 are in parallel.

The beam composing medium 21 and the iris plate 20 are supported at a predetermined position on the rear surface of the flange member 23 and fixed on the base body 15 with screws 24 and 25. The respective members in the optical path from the laser diodes 11 and 12 to the flange member 23 are unitarily fixed on the substrate 26 on which the driving circuits of the laser diodes 11 and 12 are provided, and those members serve as a light source unit. The light source unit is rotatable about the optical axis of the laser diode 11 by means of a rotating mechanism (not shown).

Figure 2:
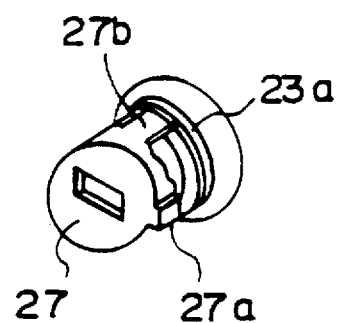
FIG. 2 is an enlarged perspective view of the aperture shown in FIG. 1.
Figure 3:
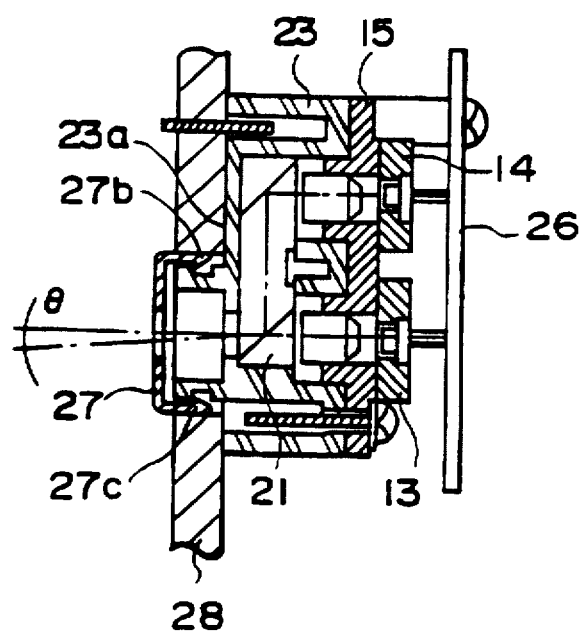
FIG. 3 is a cross sectional view showing the state of assembly of an embodiment of the multiple beam scanning apparatus according to the present invention.

An aperture 27 is rotatively supported in the cylinder portion 23a of the flange member 23, as also shown in the enlarged perspective view of FIG. 2. FIG. 3 is a cross sectional view showing assembly of the multiple beam scanning apparatus shown in FIG. 1a. The aperture 27 is provided with snapping claws 27b and 27c supported in a groove formed on the external circumference of the cylindrical portion 23a of the flange member 23 such that the aperture 27 can rotate around the flange member 23. The aperture 27 is installed into the groove 28a of the apparatus frame 28 and is fixed thereon and circumscribes the optical axis.

In the construction above described, the flange member 23 is slightly moved rotatively by an angle θ around the cylindrical portion 23a, and the light source unit 10 is rotated and adjusted on the basis of the standard inner circumference surface of the aperture 27 to achieve a desired light intensity. As the result of the rotation θ, the pitch in the sub-scanning direction of the respective axes is adjusted, and further, in order to obtain the desired dimension and shape of the light flux, the light beam is shaped by the aperture 27.

Figure 6A:
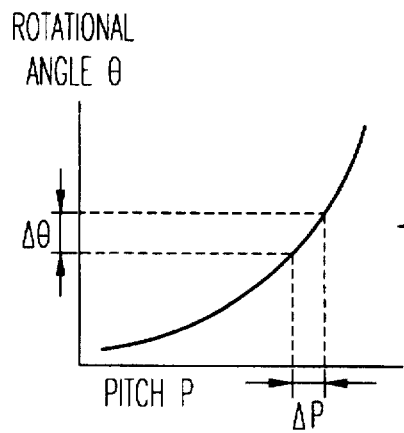
FIG. 6a is a graph illustrating the relationship between the rotational angle θ and the pitch P between the beam spots on the photosensitive member shown in FIG. 4.
Figure 6B:
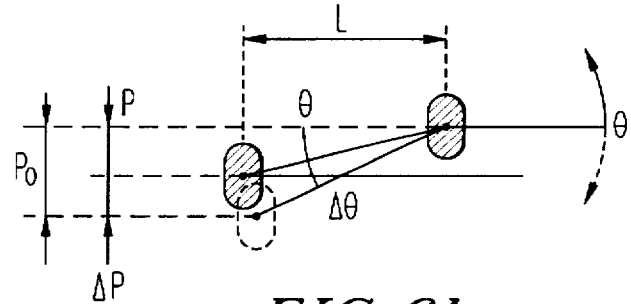
FIG. 6b is a schematic illustration showing how variation of the installment angle θ affects pitch P.

More particularly, FIG. 6a is a schematic illustration of how pitch p is varied by rotation θ of the light source unit 10. FIG. 6b is a graph illustrating the relationship between the rotational angle θ and the pitch p.

$$\Delta\theta = \arcsin((P_o - P)/L)),$$

where Po is the ideal value of pitch, P is the measured value of pitch, and L is the distance between the beam spots from the lasers 11, 12, as shown in FIG. 6a. The light source unit is fixed with the screws to the apparatus frame 28 at the rotative position where a predetermined pitch in the sub-scanning direction is obtained. In such manner, troublesome optical axis adjustment is avoided, and when the light beam is rotatively adjusted by rotating the light source unit, the position of only the aperture 27 is kept constant regardless of rotational movement of the light source, whereby the parallel orientation of the light flux with respect to the scanning lens is also maintained after passing through the aperture 27. Thereby a predetermined beam spot diameter can be obtained on the surface to be scanned.

Furthermore, since the rectangular aperture 27 is unitarily supported together with the light source unit, when the beam spot diameter is changed, it is possible to change the light source unit by adjusting the light beam. Consequently, it is possible to change the beam spot diameter only by adjusting or exchanging and readjusting the light source unit 10. Therefore the adjustment can be largely facilitated.

Furthermore, in the present embodiment, although the aperture 27 is employed as the beam shaping medium, other components such as a prism, a beam compressor, etc. having the same function can be employed in place of the aperture 27.

In the aforementioned embodiment, two laser diodes are employed. However, instead a plurality of light emitting sources arranged as an array can be used.

Figure 4:
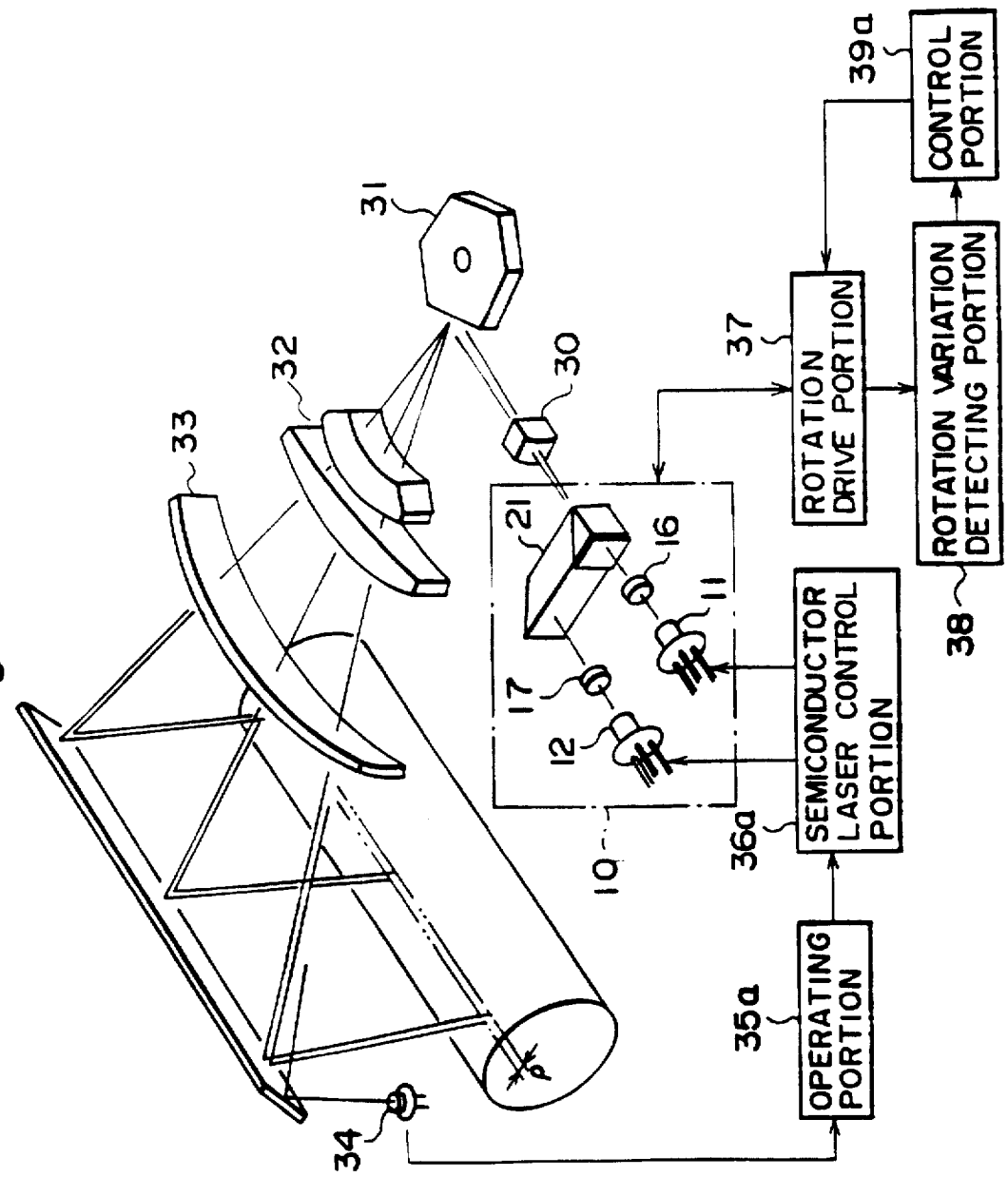
FIG. 4 is an explanatory diagram showing the system of the multiple beam scanning apparatus and an example of the first control apparatus according to an embodiment of the present invention.

Next, an example of controlling operation performed by the multiple beam scanning apparatus is described. FIG. 4 shows a system including a multiple scanning apparatus and an example of a first controlling apparatus. In FIG. 4, the light source unit 10 is constructed with the respective members arranged in the optical path from the laser diodes 11 and 12 to the flange member 23 as shown in FIG. 1. The respective beams emitted from the light source portion 10 are transmitted to a polarizing medium including a cylinder lens 30 and reflecting a multiple-surface mirror 31. The light beams thus transmitted are repeatedly polarized in the main scanning direction by rotating the above multiple-surface mirror 31. The light beams reflected on the multiple-surface mirror 31 are further projected as light spots on the predetermined scanning/recording surface by use of the scanning lens constructed with a $f-\theta$ lens 32 and a partial doughnut-shaped lens 33. At this time, the respective beams are deviated by one pitch p in the sub-scanning direction, and thereby two scanning lines are written at the same time.

A photo-sensor 34 employed as a light intensity sensing medium is disposed at a position near the surface to be scanned and detects the intensity of the scanning beam in a margin area which is not to be written into. The operating unit 35a receives the detected intensity data and calculates an intensity deviation shifted from an initial value in comparison with the predetermined standard value. The laser diode controlling unit 36a controls the beam output of the laser diode driving circuit in order to decrease the above deviation.

The above-mentioned photo-sensor 34 and laser diode controlling unit 36a perform the operation of light intensity change control. The rotation drive unit 37 is constructed of, for instance, a stepping motor, etc., and rotates the light source unit 10 and generates an encoding pulse in accordance with the rotation thereof. A rotation variation detecting unit 38 is constructed with, for instance, a rotary encoder, and the control unit 39a receives the encoded data and the rotation drive unit 37 causes the light source portion 10 to rotate to a desired position. The desired position can be manually determined by operator entry of a suitable code. Alternatively, the desired position can be automatically determined by detecting the positions of the light beam spots and thereby measuring the pitch P of the light beams on the photosensitive member, and then determining the required angle θ based on the measured value of pitch P and the desired value of pitch Po using the relationship above described. Pitch P can be measured by means of a CCD sensor (not shown) provided in the margin of the photosensitive member. Consequently, the intensity of exposure does not change even in the case of rotatively adjusting the light beam and automatically compensating the scanning line pitch, etc.

Figure 5:
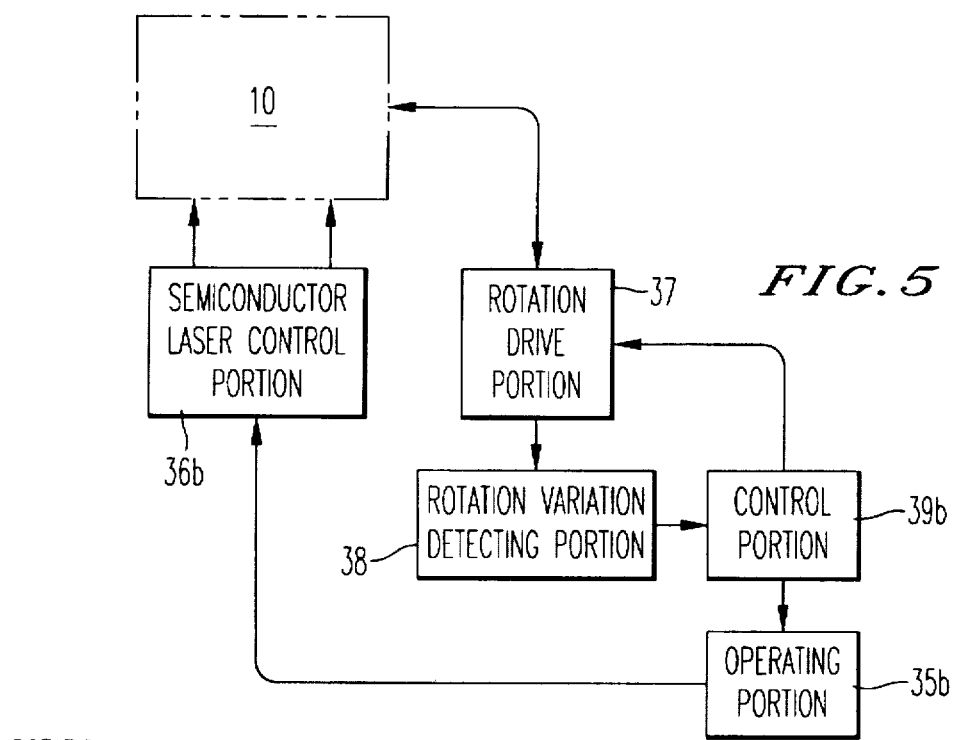
FIG. 5 is a block diagram showing an embodiment of the second control apparatus of the multiple beam scanning apparatus according to the present invention.

FIG. 5 shows a second example of the control apparatus in the multiple beam scanning apparatus of the present invention. In FIG. 5, the control unit cause the light source portion 10 to rotate to a desired position, and at the same time, receives the data from the rotation change detecting unit 38 and outputs the installment angle data of the light source unit 10 to the operational unit 35b, as in the case of performing the control operation of FIG. 4.

Figure 6C:
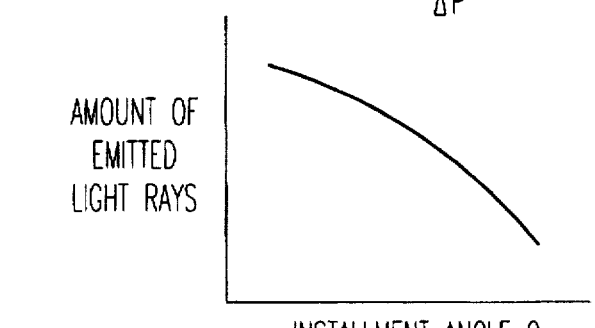
FIG. 6c is a graph showing the relationship between the installment angle θ of the light source unit and the intensity of the light rays emitted from the light source unit in an embodiment of the multiple beam scanning apparatus according to the present invention.

FIG. 6c is a graph showing the relationship between the installment angle θ of the light source unit 10 and the intensity of the emitted light rays on the surface to be scanned, i.e., the intensity of the light beams passing through the aperture 27. Since the light beams entering the aperture 27 have a defined beam shape before passing through the aperture 27, and since the aperture is stationary in relation to rotation of the light source unit 10, the amount of light (light intensity) of the beams emitted from the aperture 27 can be changed either by rotating the light source unit 10 or adjusting the aperture 27.

In FIG. 5, the previously measured value of light intensity measured by sensor 34 is memorized in the operating unit 35b. The operating portion 35b determines the installment angle θ based on the measured light intensity using the relationship shown in FIG. 6c, calculates the deviation of the measured installment angle from a standard installment angle and further calculates the variation of the light intensity. The operational unit 35b controls the laser diode controlling unit 36b in order to compensate for variations in the light intensity. The control unit 36b of the laser diode, as in the case of control unit 36a, controls the beam output of the laser diode driving circuit. Consequently, the intensity of exposing does not change even in the case of automatically compensating the scanning line pitch, etc.

Advantageous Functional Effects

According to a first aspect of the present invention, the light source unit is rotated around the optical axis and adjusted, and thereby the pitch of the respective optical axes in the sub-scanning direction is determined. Consequently, the adjustment of pitch is greatly facilitated.

Further, according to a second aspect of the present invention, since the respective light beams are shaped by the circular iris plate, the light flux diameter of the light beam passing through the beam shaping medium is kept to a predetermined value at the time of rotating the light source unit and rotatively adjusting the light beam, and thereby a predetermined beam spot can be obtained on the surface to be scanned.

According to a third aspect of the present invention, since the beam shaping medium is unitarily supported together with the light source unit, and the beam shaping medium can be rotatively moved around the optical axis thereof relative to the light source unit, it is sufficient only to change the light source unit by the rotative adjustment of the light beam at the time of changing the beam spot diameter. Consequently, the diameter of the beam spot can be changed only by exchanging the light source unit, whereby assembling and maintenance of the apparatus can be largely improved.

According to a fourth aspect of the present invention, since the beam shaping medium is unitarily supported together with the light source unit, and the beam shaping medium can be rotatively moved around the optical axis thereof relative to the light source unit, it suffices only to change the light source unit to perform rotative adjustment of the light beam.

According to a fifth aspect of the present invention, the beam shaping medium is constructed with a rectangular aperture. Therefore, it suffices only to exchange the light source unit at the time of changing the beam spot diameter. Furthermore, since the number of the parts employed for the beam shaping medium is small and the extent of the influence upon the optical axis variation is also small, assembly is facilitated and the apparatus can be small-sized.

According to a sixth aspect of the present invention, there is provided a light intensity change controlling medium for variably controlling the intensity of the light rays emitted from the laser diode in accordance with the installment angle resulting from the rotative adjustment of the light source unit. Therefore, the exposure intensity does not change at the time of rotatively adjusting the light beam and a stable precise image intensity can be obtained.

According to a seventh aspect of the present invention, since the light intensity change controlling medium is provided with a light intensity detecting medium for detecting the light intensity variation of the respective beams at the surface to be scanned, the intensity of exposing does not change even in the case of rotatively adjusting the light beam and automatically compensating the scanning line pitch, etc., and a stable image can be obtained.

According to a eighth aspect of the present invention, in the sixth status, since the light intensity change controlling medium is provided with a light intensity change calculating medium for calculating variation in the intensity of the emitted light rays in accordance with the installment angle of the light source, the exposure intensity does not change and a stable and preferable image can be obtained even in the case of automatically compensating the scanning line pitch.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A multiple beam scanning apparatus in which a plurality of light beams are repeatedly scanned at the same time, comprising:

a light source unit defining an optical axis and comprising, plural laser diodes, collimator lens means for respectively converting light beams emitted by said laser diodes to respective parallel light fluxes, and beam composing means for superposing said light beams and emitting said superposed light beams therefrom, said light source unit constructed such that respective light fluxes emitted from said beam composing means are emitted with predetermined respective different angles at least in a main scanning direction, and wherein said light source unit is rotatively adjustable around said optical axis.

2. A multiple beam scanning apparatus as defined in claim 1, further comprising:

said light source unit further comprising circular iris plate means for providing a circular slit on each optical path from each said laser diode to said beam composing means, and beam shaping means, provided downstream of said beams composing means, for shaping the superimposed light beams so that light flux emitted from said beam shaping means has a predetermined light ray flux diameter at least in a sub-scanning direction.

3. A multiple beam scanning apparatus as defined in claim 2, wherein said beam shaping means is unitarily supported with said light source unit, and said beam shaping means is rotatable around said optical axis relative to said light source unit.

4. A multiple beam scanning apparatus in which a plurality of light beams are scanned repeatedly at the same time, comprising:

a light source unit defining an optical axis and substantially unitarily constructed with a laser diode array having plural light emitting sources arranged in an array, and a collimator lens for converting light beams emitted from said laser diode array, respectively, to parallel light fluxes, said light source rotatable around the optical axis; and beam shaping means for shaping the light beams in order to form a predetermined light flux diameter at least in a sub-scanning direction of the emitted light flux, said beam shaping means unitarily supported together with said light source unit and rotatable around said optical axis relative to said light source unit.

5. A multiple beam scanning apparatus as defined in either one of claims 3 and 4, wherein said beam shaping means comprises:

a frame having a rectangular aperture.

6. A multiple beam scanning apparatus as defined in claim 5, comprising:

light intensity change controlling means for variably controlling the intensity of the light rays emitted from said laser diodes in accordance with an angle to which said light source unit is rotatively adjusted.

7. A multiple beam scanning apparatus as defined in claim 6, wherein said light intensity change controlling means comprises:

light intensity detecting means for detecting a light intensity change in the respective beams from the aperture to a surface to be scanned, for controlling the intensity of the emitted light rays based on the detected light intensity change.

8. A multiple beam scanning apparatus as defined in claim 6, wherein said light intensity change controlling means comprises:

light intensity change calculating means for calculating a changing value of the emitted light intensity in correspondence with the installment angle of said light source.

9. A method of scanning multiple light beams comprising:

constructing a substantially unitary light source unit having an optical axis around which the light source unit is rotatable, the light source unit including plural laser diodes, a collimator lens for respectively converting light beams emitted by said laser diodes to respective parallel light fluxes, and beam composing means for superposing said light beams and emitting said superposed light beams therefrom at respective different angles at least in a main scanning direction; and repeatedly scanning a plurality of light beams at the same time by use of said light source unit.

10. A method as defined in claim 9, further comprising:

providing a circular iris plate having a circular slit on each optical path from said laser diode to said beams composing means; and shaping light beams by means of a beam shaping unit downstream of said beams composing means to form a predetermined light rays flux diameter at least in a sub-scanning direction.

11. A method as defined in claim 10, comprising:

unitarily supporting said beam shaping unit with said light source unit, with said beam shaping unit being rotatable relative to said light source unit around the optical axis.

12. A method of scanning a multiple beam, comprising:

constructing a substantially unitary light source unit including a laser diode array having plural light emitting sources arranged in an array, and a collimator lens for converting light beams emitted from said laser diode array, respectively, to parallel light fluxes, said light source unit capable of being rotatively adjusted around an optical axis of the light beams from said laser diode array;

shaping the light beams in order to form a predetermined light flux diameter at least in a sub-scanning direction of the emitted light flux by means of a beam shaping unit unitarily supported together with said light source, said beam shaping unit being rotatable around said optical axis thereof relative to said light source unit; and scanning said plurality of light beams repeatedly at the same time.

13. A method as defined in either one of claims 11 and 12, comprising:

constructing said beam shaping unit of a frame having a rectangular aperture.

14. A method as defined in claim 13, comprising:

variably controlling the intensity of the light beams emitted from said array by adjusting an installment angle of rotation of the light source unit.

15. A method of scanning a multiple beam as defined in claim 14, comprising:

detecting a change in light intensity of the respective beams from the aperture to the surface to be scanned, and controlling the intensity of the emitted light beams based on the detected light intensity change.

16. A method of scanning a multiple beam as defined in claim 14, wherein said controlling step comprises:

relating a changing value of the emitted light intensity based to the installment angle of said light source unit.

17. A method of scanning a multiple beam as defined in claim 14, wherein said controlling step comprises:

varying the installment angle of said light source unit to control pitch of the scanned light beams.

* * * * *